United States Patent [19]

Tung

[11] 4,004,341
[45] Jan. 25, 1977

[54] METHOD OF MANUFACTURING FIELD-EFFECT TRANSISTORS DESIGNED FOR OPERATION AT VERY HIGH FREQUENCIES, USING INTEGRATED TECHNIQUES

[75] Inventor: Pham Ngu Tung, Paris, France
[73] Assignee: Thomson-CSF, Paris, France
[22] Filed: Dec. 5, 1975
[21] Appl. No.: 638,037
[30] Foreign Application Priority Data Dec. 13, 1974 France .............. 74.41129

[52] U.S. Cl. .............................. 29/571; 29/578;
 29/580; 357/23
[51] Int. Cl.² .................................. B01J 17/00
[58] Field of Search ............... 29/571, 578, 576 B,
 29/580

[56] References Cited
UNITED STATES PATENTS

| | | | |
|---|---|---|---|
| 3,330,696 | 7/1967 | Ullery | 29/576 B |
| 3,498,833 | 3/1970 | Lehrer | 29/578 |
| 3,574,010 | 4/1971 | Brown | 29/571 |
| 3,875,656 | 4/1975 | Handy | 29/571 |

*Primary Examiner*—W. Tupman
*Attorney, Agent, or Firm*—Oblon, Fisher, Spivak, McClelland & Maier

[57] ABSTRACT

A method of manufacturing, making it possible to effect the simultaneous batch production in particular of field-effect transistors operating at frequencies in excess of 30 Gc/s, whose source and drain constitute two very narrow and very closely spaced bands, is provided. To this end, using a single masking operation, the source and drain of contacts are produced, these being covered by a chromium band. This band acts as a mask during the ion machining of a trench between the bands. The aluminium subsequently deposited, in particular in the trench, in order to form the gate of the transistor, is removed from the other regions of the structure by electrolytic etching. Along with the chromium, the aluminium serves as a mask during a final step of ion etching, which makes it possible to produce a "mesa" structure.

10 Claims, 7 Drawing Figures

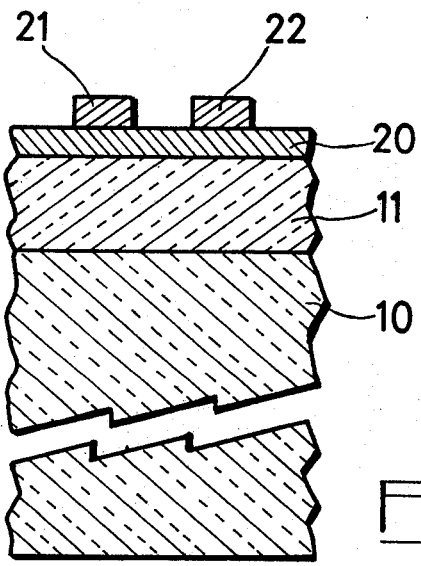
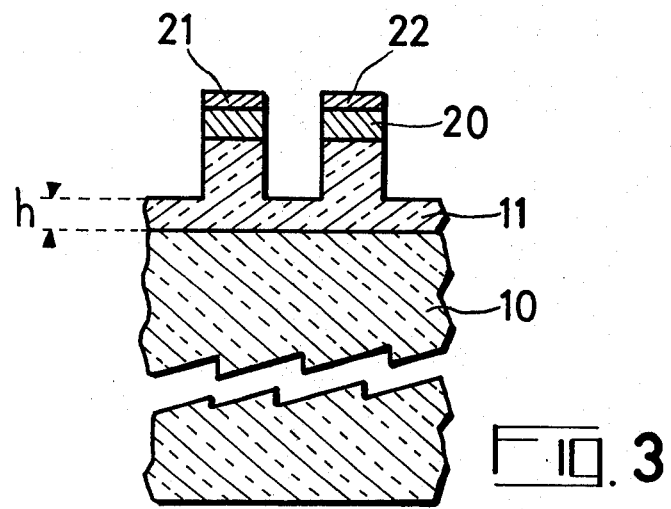

METHOD OF MANUFACTURING FIELD-EFFECT TRANSISTORS DESIGNED FOR OPERATION AT VERY HIGH FREQUENCIES, USING INTEGRATED TECHNIQUES

The present invention relates to structures integrated into one and the same semi-conductor wafer, comprising at least one field-effect transistor designed to operate at a frequency in excess of around 10 gigahertz, in particular beyond 30 Gc/s. In similar situations, the semi-conductor wafer is constituted by an element having very high resistivity, as for example a semi-insulating gallium arsenide monocrystal. The wafer acts as the substrate for a field-effect transistor structure of "mesa" design, that is to say isolated from the neighbouring structures by a groove which bares the semi-insulating substrate.

In the conventional method of manufacturing field-effect transistors, epitaxial methods are used to deposit a layer in which the conduction channel is to be formed, following which by masking operations and successive deposition operations, the source, gate and drain contacts are formed. Finally, the epitaxial layer is etched to produce a mesa structure. In the case of transistors designed to operate at frequencies beyond 30 Gc/s, certain dimensions are no more than a fraction of a micron, in particular the depth of the channel, the source-drain interval being of the order of 1 micron. The successive operations of masking become difficult in particular where sufficiently accurate positioning is concerned. In the case of integrated circuits, where tens and hundreds of structures are to be produced upon one and the same wafer, the manufacturing efficiency drops to an extremely low level which makes it necessary to return to manufacturing unitary components. One of the objects of the invention is to make it possible to carry out batch production, that is to say the simultaneous manufacture of a large number of structures, at an acceptable level of efficiency and moderate cost price.

According to the invention, there is provided a method of manufacturing field-effect transistors designed to operate at very high frequencies, using integrated circuit techniques, said method commencing from a substrate of semi-insulating material covered by a semi-conductor layer having a given conductivity type, said method comprising the following steps:

— the deposition upon said semi-conductor layer of a conductive layer designed ultimately to form the source and drain contacts;

— ion etching, over an area delimited by a metal mass protecting said contacts, and carried out by means of ions of given kind, energy and density, which bombard said semi-conductor layer;

— deposition of a protective layer which can be etched by a solvent, over an area delimited by masking and excluding the interval separating said contacts;

— deposition of a metal layer upon the assembly produced in the preceding step, the thickness of said deposition being minimum over areas perpendicular to said semi-conductive layer, said layer constituting the gate in the interval separating said contacts;

— electrolytic etching of said metal layer, except in the interval separating said contacts;

— elimination of said protective layer using a solvent;

— ion etching eliminating said semi-conductor layer at the locations where it is exposed.

The invention will be better understood and other of its features rendered apparent from a consideration of the ensuing description and the accompanying drawings in which:

FIGS. 2 to 6 illustrate the main stages in the method of the invention.

As mentioned earlier, the method of the invention is applicable to the manufacture in batch form, of a large number of structures on one and the same wafer, constituting an initial substrate common to said structures. In the embodiment described hereinafter, we are dealing with a portion of a wafer, designed to carry the field-effect transistor chosen by way of example. It should be understood, that each of the operations described and illustrated hereinafter, is performed simultaneously on other portions of the wafer, in accordance with patterns cut in a single mask at each stage of manufacture.

Figure 1:
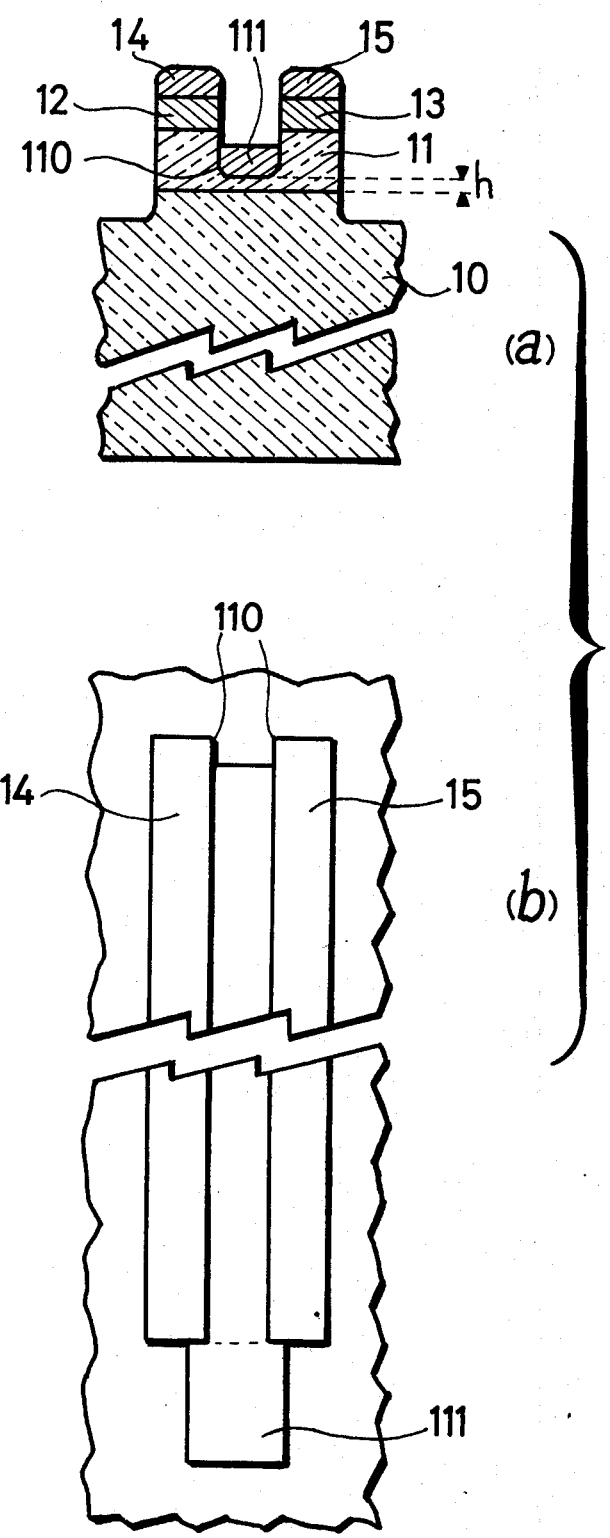
FIG. 1 illustrates at (a) a transverse section and (b) a plan view, of a field-effect transistor very like the component obtained by the method of the invention.

The structure shown by way of example in FIG. 1 is produced from a part 10 of a monocrystalline gallium arsenide wafer having a thickness of 300 to 400 microns. This wafer has been subjected to an ionic treatment of known kind, designed to render it semi-conductive. The basic structure of the field-effect transistor comprises, in addition to the substrate portion:

— a band 11 of N-doped gallium arsenide (length: some few hundreds of microns; width; 3 to 4 microns; thickness around 3 microns); this comprises at its central zone a trench 110 having a width of the order of 1 micron and a depth such that it leaves the height "$h$" of 0.5 microns for the region where the channel is to be formed;

— ohmic contacts comprising an arrangement of bands 12 and 13 (gold and germanium alloys covered with nickel) and aluminium deposits 14 and 15, forming source and drain contacts — an aluminium deposit 111 constituting a SCHOTTKY gate deposited at the bottom of the trench 110.

In the following, the successive steps of manufacture of a structure very like the one shown in FIG. 1, will be described: Step (a): on a semi-insulating gallium arsenide wafer, there is deposited for example by epitaxy, a semi-conductor layer (for example of gallium arsenide) doped with N-type impurities (tin or tellurium atoms) in a concentration ranging from $10^{16}$ to $10^{17}$ atoms per cubic centimeter.

The thickness of the layer (marked 11 in FIGS. 1 and 2) will for example be 3 microns. For reasons of simplicity of manufacture, this thickness is at least one micron, which is sufficient to achieve in the ensuing step (d) a channel of around 0.5 microns in depth. Step (b): on the semi-conductor layer deposited at step (a), there is in turn deposited a layer (marked 20 in FIG. 2), constituted by:

— either a gold and germanium alloy comprising for example 80 to 90% gold and 10 to 20% germanium; 90

— or an identical alloy covered by a layer of pure nickel (some few angstrom units in thickness).

The thickness of the layer 20 is of the order of one thousand angstrom units.

The deposit is produced for example by vapourisation under vacuum of a gold-germanium alloy, followed, if required, by vaporization under vacuum of pure nickel. The layer thus formed is subjected to a heat treatment for example by maintaining the wafer at 450° C for around 5 minutes in an oven containing a hydrogen atmosphere. Step (c): on the layer deposited in step (b), there are deposited two bands of chromium (marked 21 and 22 in FIG. 2) having a thickness of around 3000 angstrom units. The formation of these band is achieved by a conventional method of masking and exposure of a photosensitive resin, using a mask cut out in accordance with the pattern of the pairs of bands 21 and 22 (the mask serving to form all the structures on one and the same wafer). After developing the resin, elongated cavities are obtained corresponding to the pairs of bands 21 and 22 which are to be formed. By vapor-deposition of chromium under vacuum, the cavities are filled and the resin covered with a layer whose thickness is equal to the depth of the cavities. After dissolving the resin, the chromium deposited thereon disappears as well and all that is left are the pairs of bands 21 and 22. The assembly of operations requires no major precision as far as the positioning of the bands in relation to the wafer is concerned; it is only the difference between the bands of each pair which must be controlled with an accuracy of better than one micron (of the order of one tenth of a micron if possible). Step (d): ion etching of the structure produced in step (c) is performed, by introducing the wafer into an ion-machining device comprising an argon ion source producing ions with an energy of 1 keV, the ion bombardment density corresponding to a current of 1 mA/cm$^2$. If certain parts of the wafer comprising structures for etching, are to be protected, then these are covered with a metal mask (aluminium or chromium for example, of sufficient thickness, say one to several millimeters). Those skilled in the art will be aware that under the ion bombardment conditions referred to earlier, the etching rates are as follows:

— 2500 angstroms per minute for gallium arsenide;
— 200 angstroms per minute for chromium;
— 400 angstroms per minute for aluminium.

Figure 4:
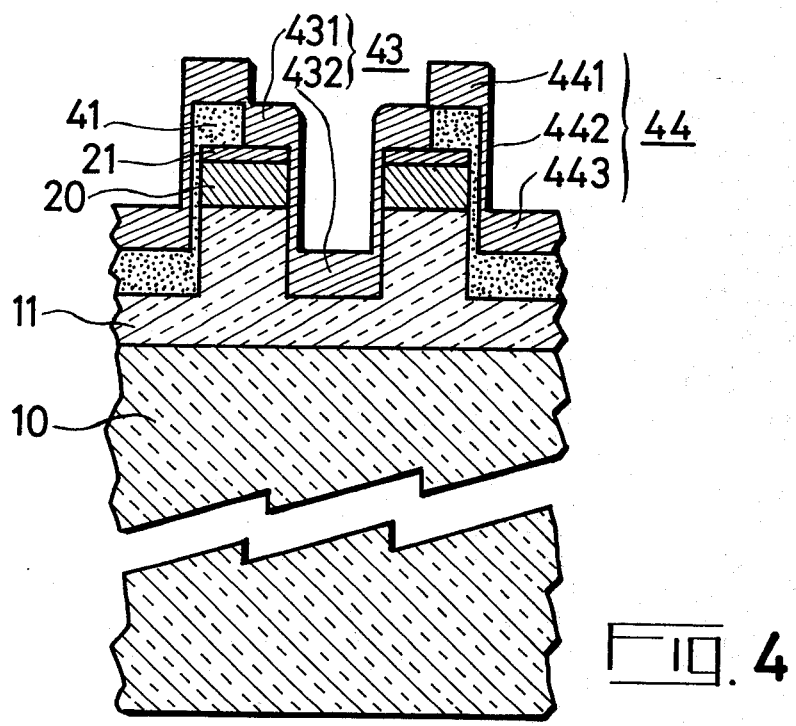

FIG. 3 illustrates the structure after a certain time of ion machining, for example around five minutes. The layer 20 has disappeared outside the bands 21 and 22 which are left behind albeit with a much smaller thickness. The layer 11 is deeply etched and all that is left is a thickness "$h$". This thickness is regulated by halting machining in accordance with the information furnished by a structural specimen used as a witness under the normal conditions of ion machining. A trench is thus obtained in layer "$h$" between bands 21 and 22. Step (e): a resin mask 41 is deposited upon the structure obtained after step (d) then shown again in FIG. 4. The resin mask covers the assembly of the structure with the exception of the trench and the brink of the same. In order to limit the accuracy required to form the mask, only part of the bands 21 and 22 is covered by the mask 41. This masking can be performed with the help of electron-sensitive resin (for example methyl polymethacrylate), in an electronic masking machine. The thickness of the resin is of the order of 0.5 microns.

Figure 5:
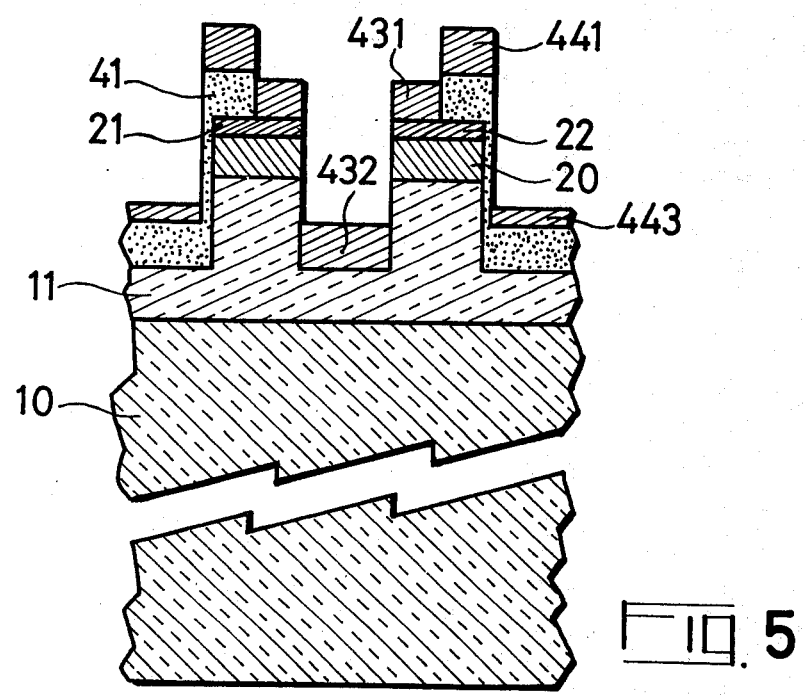
Figure 6:
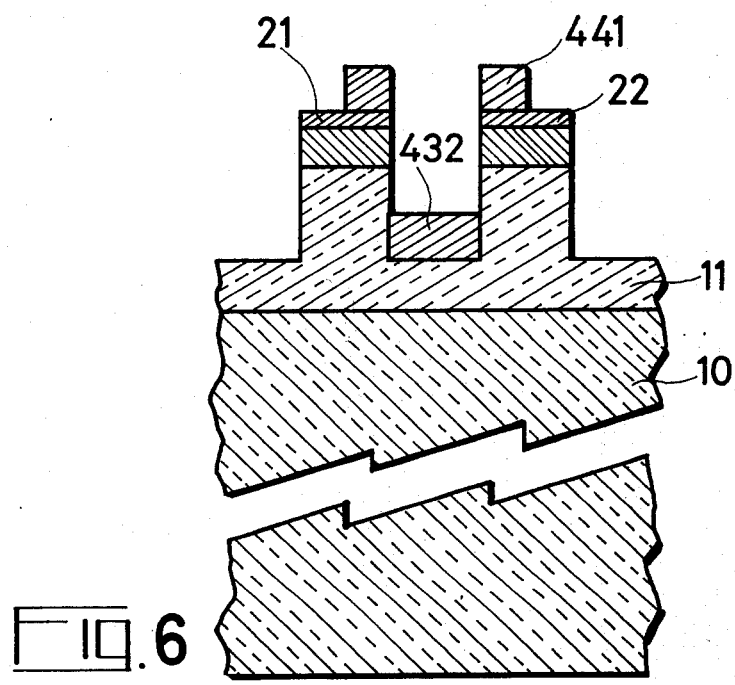
Figure 7:
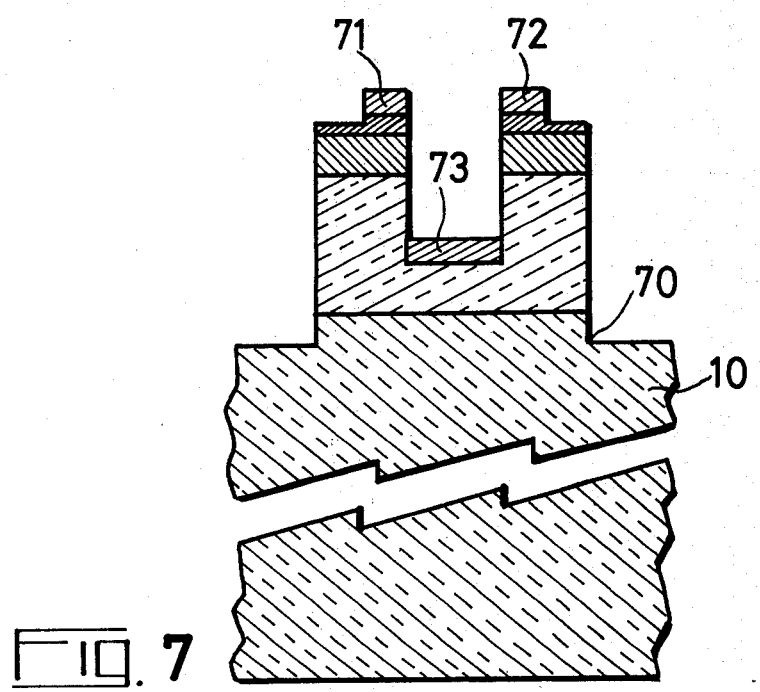
FIG. 7 illustrates the transistor finally obtained.

Then, using techniques of vaporization under vacuum, deposition of an aluminium layer upon the overall structure is carried out. This vapor deposition is directional (carried out using a source arranged at an interval) and perpendicular to the major area of the wafer 10. Thus, the deposits shown in FIG. 4 and indicated by the following references, are obtained:

— 43, the central area, comprising the layers 431 (at the top level) and 432 (at the bottom level), with a thickness of 0.5 microns, these layers being connected by a very thin band;
—, 44, the lateral areas, comprising the layers 441 (at the top level) and 443 (at the bottom level) connected by very much thinner bands 442. Step (f): the aluminium layer deposited in step (e) is Step (h) electrolytically etched. The etching is limited to the layer 443 by establishing the electrode contact on deposit 443. As soon as the band 442 is eliminated, this taking place rapidly because of its small thickness, electrolytic etching ceases except in the case of the layer 443, and the structure shown in FIG. 5 is obtained where there is very little aluminium left at 443. Step (g): the resin 41 is removed by means of a solvent and in this fashion the structure shown in FIG. 6 is obtained, the layers 441 and 443 having been eliminated at the same time as the resin which hitherto carried them. Step (h): fresh ion etching is carried out under the same conditions as specified in step (d) but using a witness specimen chosen in such a fashion that etching is halted when the layer 11 and a superficial layer on the wafer 10, have been eliminated from the periphery of the structure. As FIG. 7 shows, a groove 70 is formed. The remaining aluminium deposits (this metal resisting ion etching better than the semi-conductor material) constitute the contacts 71 and 72 for a source and drain, as well as the contacts 73 for the SCHOTTKY gate.

The method of manufacture described can be modified in the following way without departing from the scope of the invention:

— in step (a), the starting point can be a sapphire wafer (pure alumina crystal) or indium phosphide wafer;
— in step (c), recourse can be had to the technique known as electronic masking, using electron-sensitive resins;
— in step (e), if the requisite accuracy is not too high, it is possible to use photographic masking with photosensitive resin;
— in said same step (e), a metal other than aluminium can be deposited, provided that it has good electrical conductivity.

The invention applies to the manufacture of structures derived from field-effect transistors, of the kind described and illustrated:

— saturable resistor, obtained by connecting the source to the gate through a permanent connection;
— diode obtained by using the SCHOTTKY junction only.

The invention makes it possible to achieve operating frequencies in excess of 30 Gc/s.

What I claim:

1. A method of manufacturing field-effect transistors designed to operate at very high frequencies, using integrated circuit techniques, said method commencing from a substrate of semi-insulating material covered by a semi-conductor layer having a given conductivity type, said method comprising the following steps:
   - the deposition upon said semi-conductor layer of a conductive layer designed ultimately to form the source and drain contacts;
   - ion etching, over an area delimited by a metal mass protecting said contacts, and carried out by means of ions of given kind, energy and density, which bombard said semi-conductor layer;

- deposition of a protective layer which can be etched by a solvent, over an area delimited by masking and excluding the interval separating said contacts
- deposition of a metal layer upon the assembly produced in the preceding step, the thickness of said deposition being minimum over areas perpendicular to said semi-conductive layer, said layer constituting the gate in the interval separating said contacts;

electrolytic etching of said metal layer, except in the interval separating said contacts;
- elimination of said protective layer using a solvent;
- ion etching eliminating said semi-conductor layer at the locations where it is exposed.

2. A method as claimed in claim 1, wherein the same substrate is used for the simultaneous manufacture of several field-effect transistors.

3. A method as claimed in claim 1, wherein said semi-insulating material is gallium arsenide, said semi-conductor layer being constituted by gallium arsenide doped with N-type impurities.

4. A method as claimed in claim 1, wherein said semi-conductor material is pure alumina.

5. A method as claimed in claim 1, wherein said semi-conductor material is indium phosphide.

6. A method as claimed in claim 1, wherein said metal mass is constituted by a chromium layer produced during an intermediate step involving a prior masking operation and deposition of chromium by vaporization under vacuum.

7. A method as claimed in claim 1, wherein said ion etching is performed using argon ions having an energy of around 1 keV and a density corresponding to a current of around 1 mA/cm$^2$.

8. A method as claimed in claim 1, wherein said protective layer is constituted by a resin obtained by developing a resin mask which is sensitive to electrons or photons.

9. A method as claimed in claim 1, wherein said conductive layer is constituted by an alloy and said metal layer by aluminium.

10. A method as claimed in claim 1, wherein said electrolytic etching is performed by establishing an electrode contact on a part of said metal layer which is located outside the interval separating said contacts.

* * * * *